(12) United States Patent
Lim et al.

(10) Patent No.: US 10,466,821 B2
(45) Date of Patent: Nov. 5, 2019

(54) DISPLAY DEVICE

(71) Applicant: SAMSUNG DISPLAY CO., LTD., Yongin-Si, Gyeonggi-Do (KR)

(72) Inventors: Sang Hyun Lim, Yongin-si (KR); Chang Sub Jung, Yongin-si (KR); A Ra Jo, Yongin-si (KR); Jae Woo Choi, Yongin-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 107 days.

(21) Appl. No.: 15/603,660

(22) Filed: May 24, 2017

(65) Prior Publication Data

US 2017/0357354 A1 Dec. 14, 2017

(30) Foreign Application Priority Data

Jun. 10, 2016 (KR) .......................... 10-2016-0072658

(51) Int. Cl.
*G06F 3/041* (2006.01)
*G06F 3/044* (2006.01)

(52) U.S. Cl.
CPC ............ *G06F 3/0412* (2013.01); *G06F 3/044* (2013.01); *G06F 2203/04105* (2013.01)

(58) Field of Classification Search
CPC ................... G06F 3/0412; G06F 3/044; G06F 2203/04105
See application file for complete search history.

(56) References Cited

U.S. PATENT DOCUMENTS

| 2004/0104727 | A1* | 6/2004 | Morimoto | G01D 5/2417 324/409 |
| 2010/0171708 | A1* | 7/2010 | Chuang | G06F 3/041 345/173 |
| 2010/0253645 | A1* | 10/2010 | Bolender | G06F 3/0414 345/174 |
| 2012/0314383 | A1* | 12/2012 | Oohira | G02F 1/13452 361/749 |
| 2013/0018489 | A1* | 1/2013 | Grunthaner | G06F 3/041 700/73 |

(Continued)

FOREIGN PATENT DOCUMENTS

| KR | 1020120007894 | 1/2012 |
| KR | 1020130088534 | 8/2013 |

(Continued)

*Primary Examiner* — Amare Mengistu
*Assistant Examiner* — Crystal Mathews
(74) *Attorney, Agent, or Firm* — F. Chau & Associates, LLC

(57) ABSTRACT

A display device includes a display panel configured to display an image on a front surface thereof, and a flexible circuit board connected to the display panel and configured to drive the display panel. The display device further includes a pressure sensor including a first electrode and a second electrode. The pressure sensor is configured to sense a change of capacitance of a capacitor, which is formed between the first electrode and the second electrode, in accordance with a pressure applied thereto. The flexible circuit board includes a first surface and a second surface facing the first surface. The first electrode and the second electrode are disposed on the first surface or the second surface.

19 Claims, 12 Drawing Sheets

(56) References Cited

U.S. PATENT DOCUMENTS

| | | | |
|---|---|---|---|
| 2013/0147739 A1* | 6/2013 | berg | G06F 3/0488 |
| | | | 345/173 |
| 2014/0111953 A1* | 4/2014 | McClure | G06F 3/044 |
| | | | 361/749 |
| 2015/0153951 A1 | 6/2015 | Kim et al. | |
| 2015/0296622 A1* | 10/2015 | Jiang | G01L 1/2268 |
| | | | 361/750 |
| 2017/0199712 A1* | 7/2017 | Lee | G01B 7/22 |
| 2017/0212616 A1* | 7/2017 | Zou | G06F 3/044 |
| 2017/0299448 A1* | 10/2017 | Campbell | G01L 1/044 |
| 2018/0081481 A1* | 3/2018 | Fournier | H01M 2/1016 |
| 2018/0300522 A1* | 10/2018 | Shen | G06K 9/0002 |

FOREIGN PATENT DOCUMENTS

| | | |
|---|---|---|
| KR | 1020150066885 | 6/2015 |
| KR | 10-1594174 | 2/2016 |

* cited by examiner

DISPLAY DEVICE

CROSS-REFERENCE TO RELATED APPLICATION

This application claims priority under 35 U.S.C. § 119 to Korean Patent Application No. 10-2016-0072658 filed on Jun. 10, 2016 in the Korean Intellectual Property Office, the disclosure of which is incorporated by reference herein in its entirety.

TECHNICAL FIELD

An exemplary embodiment of the present invention relates to a display device, and more particularly, to a display device including a capacitor connected to a flexible circuit board.

DISCUSSION OF THE RELATED ART

Generally, a display device may include a touch sensor, for receiving a touch input of a user, together with a display panel for displaying an image. Accordingly, a user can use the display device through the touch sensor.

In addition, a display device may provide various functions to a user based on applied pressure of the user's touch input.

SUMMARY

An exemplary embodiment of the present invention is to provide a display device which senses pressure of a touch by using a pressure sensor disposed on one surface of a flexible circuit board without using other conductive members.

According to an exemplary embodiment of the present invention, a display device includes a display panel configured to display an image on a front surface thereof, and a flexible circuit board connected to the display panel and configured to drive the display panel. The display device further includes a pressure sensor including a first electrode and a second electrode. The pressure sensor is configured to sense a change of capacitance of a capacitor, which is formed between the first electrode and the second electrode, in accordance with a pressure applied thereto. The flexible circuit board includes a first surface and a second surface facing the first surface. The first electrode and the second electrode are disposed on the first surface or the second surface.

In an exemplary embodiment of the present invention, a first end of the flexible circuit board is connected to the display panel, and a first portion of the flexible circuit board is folded or bent and is disposed on a rear surface of the display panel.

In an exemplary embodiment of the present invention, the first surface includes a first area in which the first electrode is disposed, and a second area in which the second electrode is disposed. The first portion of the flexible circuit board includes the first area and the second area.

In an exemplary embodiment of the present invention, the flexible circuit board is folded or bent in a direction in which the first area faces the second area such that the first electrode and the second electrode overlap each other.

In an exemplary embodiment of the present invention, the display device further includes an elastic layer disposed between the first electrode and the second electrode.

In an exemplary embodiment of the present invention, the flexible circuit board further includes a ground electrode disposed on the second surface.

In an exemplary embodiment of the present invention, the flexible circuit board further includes a first conductive guard and a second conductive guard each disposed on the second surface. The first conductive guard faces the first electrode and the second conductive guard faces the second electrode.

In an exemplary embodiment of the present invention, the flexible circuit board further includes an extension portion which extends from the first area. The extension portion is folded or bent in a direction towards the second area.

In an exemplary embodiment of the present invention, the display device further includes an elastic layer which is disposed between the first area and the second area.

In an exemplary embodiment of the present invention, the second surface includes a first area in which the first electrode is disposed, and a second area in which the second electrode is disposed. The flexible circuit board is folded or bent in a direction in which the first area faces the second area such that the first electrode and the second electrode overlap each other.

In an exemplary embodiment of the present invention, the display device further includes an elastic layer disposed between the first electrode and the second electrode.

In an exemplary embodiment of the present invention, the flexible circuit board further includes a ground electrode disposed on the first surface.

In an exemplary embodiment of the present invention, the flexible circuit board further includes a first conductive guard and a second conductive guard each disposed on the first surface. The first conductive guard faces the first electrode and the second conductive guard faces the second electrode.

In an exemplary embodiment of the present invention, the display device further includes a touch panel disposed on the display panel and configured to sense a touch.

According to an exemplary embodiment of the present invention, a display device includes a display panel, and a flexible circuit board connected to the display panel, and including a first surface, a second surface facing the first surface, and a first bend portion bending around the display panel such that the flexible circuit board is disposed on a first surface of the display panel. The display device further includes a pressure sensor including a capacitor having a first electrode and second electrode facing the first electrode. The first electrode and the second electrode are each disposed on the first surface or the second surface of the flexible circuit board.

In an exemplary embodiment of the present invention, the first surface of the flexible circuit board includes a first area in which the first electrode is disposed and a second area in which the second electrode is disposed. The flexible circuit board includes a second bend portion bending in a direction such that the first electrode and the second electrode are aligned with each other.

In an exemplary embodiment of the present invention, the flexible circuit board further includes an extension portion extending from the first area and bending in a direction such that the extension portion is in contact with the first surface of the flexible circuit board.

In an exemplary embodiment of the present invention, an elastic layer is disposed between the first electrode and the second electrode.

In an exemplary embodiment of the present invention, the elastic layer may include an airgap, a shock absorbing material, or a dielectric material.

In an exemplary embodiment of the present invention, a ground electrode is disposed between the flexible circuit board and the display panel.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Exemplary embodiments of the present invention will be described more fully hereinafter with reference to the accompanying drawings. It is to be understood that the present invention may have different forms and thus should not be construed as being limited to the exemplary embodiments set forth herein.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the spirit and scope of the present invention.

It will be understood that when an element is referred to as being "connected" or "coupled" to another element, the element may be directly connected or coupled to the other element or intervening elements.

As used herein, the singular forms "a," "an" and "the" are intended to include the plural forms as well, unless the context clearly indicates otherwise.

Figure 1:
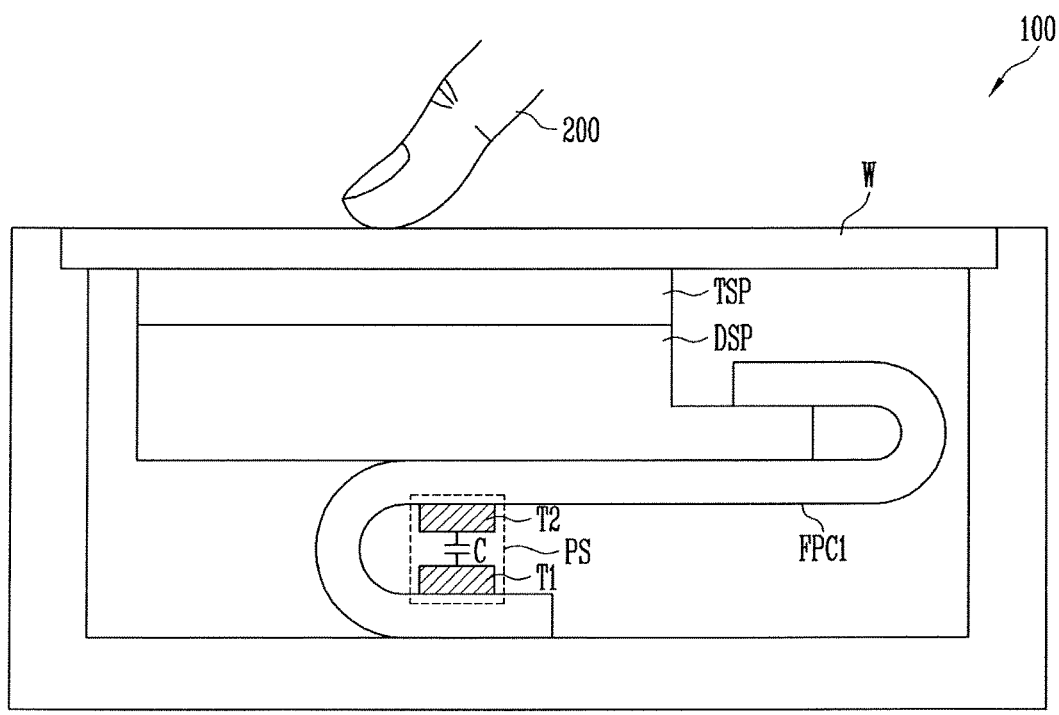
FIG. 1 is a cross-sectional view of a display device according to an exemplary embodiment of the present invention.

FIG. 1 is a cross-sectional view of a display device 100 according to an exemplary embodiment of the present invention.

As illustrated in FIG. 1, a display device 100, according to an exemplary embodiment of the present invention, may include a window W, a touch panel TSP, a display panel DSP, a flexible circuit board FPC1, and a pressure sensor PS.

The window W may overlap an upper portion of the display panel DSP, and may protect the display panel DSP from an external environment by enclosing it in the display device 100.

The window W may include a transparent material. For example, the window W may include a plastic material such as acrylic with an impact resistance and light transmitting property, or a glass material.

The touch panel TSP may sense a touch of a user 200. The touch panel TSP may sense a touch with a predetermined pressure being applied to the touch panel TSP. For example, the touch panel TSP may sense a touch with a relatively low pressure being applied. In addition, the touch panel TSP may sense not only a physical touch of the user 200 but also a touch of a tool such as a stylus.

The touch panel TSP may overlap the display panel DSP in a planar view. The touch panel TSP may be disposed on a front surface of the display panel DSP. However, exemplary embodiments of the present invention are not limited thereto. For example, the touch panel TSP may be disposed on any one of a front surface and a rear surface of the display panel DSP.

The display panel DSP may display an image by using light emission of pixels.

For example, the display panel DSP may include an organic light emitting display panel, a liquid crystal display panel, a plasma display panel, or the like, but the display panel DSP is not limited to this.

The display panel DSP may include a front surface on which an image is displayed, and a rear surface opposite to the front surface.

The display panel DSP may display an image on at least one surface, according to an exemplary embodiment of the present invention. A surface on which an image is displayed may be a flat surface without curvature, or may be a curved surface with predetermined curvature. In addition, a surface on which an image is displayed may be a flexible surface of a flexible display panel DSP that may be bent or rolled.

The display panel DSP may be positioned between the touch panel TSP and the flexible circuit board FPC1.

The flexible circuit board FPC1 may be connected to the display panel DSP to drive the display panel DSP. The flexible circuit board FPC1 may include a driver circuit, which drives the display panel DSP.

A camera module, a speaker module, a memory and the like, which are operatively connected to the display panel DSP, may be operatively connected to the flexible circuit board FPC1. The flexible circuit board FPC1 may generate a control signal which controls an image that is displayed on the display panel DSP, according to an exemplary embodiment of the present invention.

For example, the flexible circuit board FPC1 may be a flexible printed circuit board (FPCB) or a chip on film (COF).

The flexible circuit board FPC1 may have one end connected to the display panel DSP and a portion bent or folded around the display panel DSP to be disposed on a rear surface of the display panel DSP.

The pressure sensor PS may include a first electrode T1, a second electrode T2, and a capacitor C formed between the first electrode T1 and the second electrode T2.

For the pressure sensor PS to precisely measure an amount of touch pressure, a capacitor C with a constant capacitance, formed by the first electrode T1 and the second electrode T2, may be used. The larger the areas of the first electrode T1 and the second electrode T2 which face each other are, or the greater the lengths of the first electrode T1 and the second electrode T2 which face each other are, the greater the capacitance of the capacitor C is. Thus, to correspond to a predetermined capacitance range, the areas of the first electrode T1 and the second electrode T2 which face each other, the lengths, the shapes of the first electrode T1 and the second electrode T2 may be variously set.

If pressure is applied to the display device 100 by a touch of the user 200, a gap between the first electrode T1 and the second electrode T2 may be changed. Thus, the capacitance of the capacitor C may be changed. Here, the pressure, which is applied to the display device 100, may be generated by a touch of the user 200, but the invention is not limited to this, and the pressure may be generated by various other means. For example, the pressure may be generated by a touch of a stylus.

The pressure sensor PS may detect the intensity of the pressure which is generated by a touch of the user 200 by using the amount of change of the capacitance of the capacitor C.

The first electrode T1 and the second electrode T2 of the pressure sensor PS may be disposed to be separated from each other, and another element may be disposed between the first electrode T1 and the second electrode T2. For example, an air gap, an insulating material, or the like may be disposed between the first electrode T1 and the second electrode T2.

The first electrode T1 and the second electrode T2 may each be patterned on one surface of the flexible circuit board FPC1, according to an exemplary embodiment of the present invention.

Each of the first electrode T1 and the second electrode T2 may include a conductive material.

Each of the first electrode T1 and the second electrode T2 may include a metal or an alloy, according to an exemplary embodiment of the present invention.

Each of the first electrode T1 and the second electrode T2 may include at least one of, for example, gold (Au), silver (Ag), aluminum (Al), molybdenum (Mo), chromium (Cr), titanium (Ti), nickel (Ni), neodymium (Nd), copper (Cu), and platinum (Pt).

The first electrode T1 and the second electrode T2 may include a transparent and conductive material, according to an exemplary embodiment of the present invention.

Each of the first electrode T1 and the second electrode T2 may include at least one of, for example, AgNW (silver nanowire), ITO (Indium Tin Oxide), IZO (Indium Zinc Oxide), AZO (Antimony Zinc Oxide), ITZO (Indium Tin Zinc Oxide), ZnO (Zinc Oxide), $SnO_2$ (Tin Dioxide), Carbon Nano Tube, and graphene.

Each of the first electrode T1 and the second electrode T2 may be a single film or a multi-layer film.

Each of the first electrode T1 and the second electrode T2 may include a multilayer film in which materials different from one another are stacked, according to an exemplary embodiment of the present invention.

In addition, each of the first electrode T1 and the second electrode T2 may include the same material or materials different from one another.

Each of the first electrode T1 and the second electrode T2 may be a plate and have a rectangular shape. However, the present invention is not limited thereto. For example, the first and second electrodes T1 and T2 may have various shapes.

Figure 2:
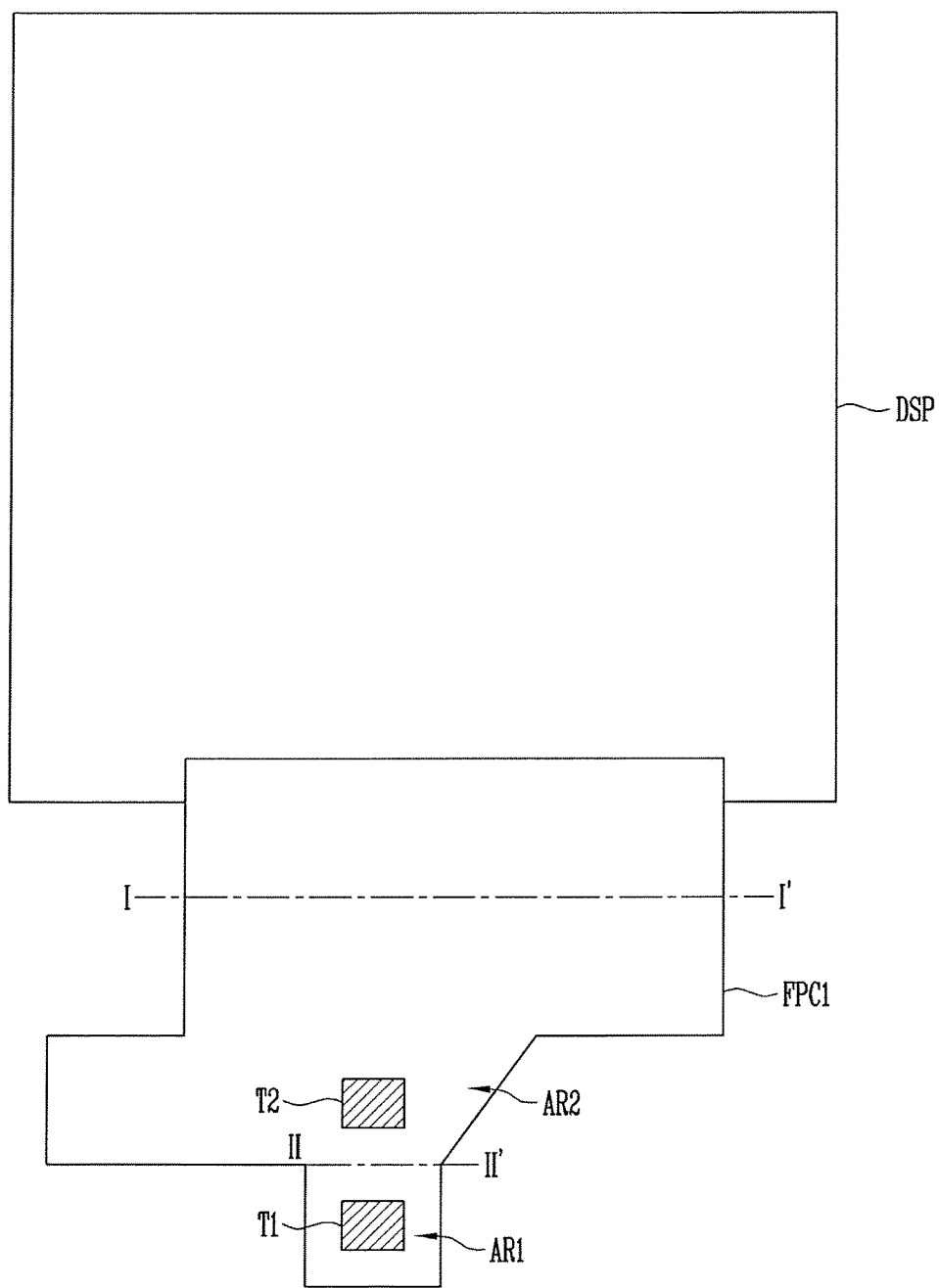
FIG. 2 is a plan view schematically illustrating a connection relationship between a display panel and a flexible circuit board according to an exemplary embodiment of the present invention.
Figure 3:
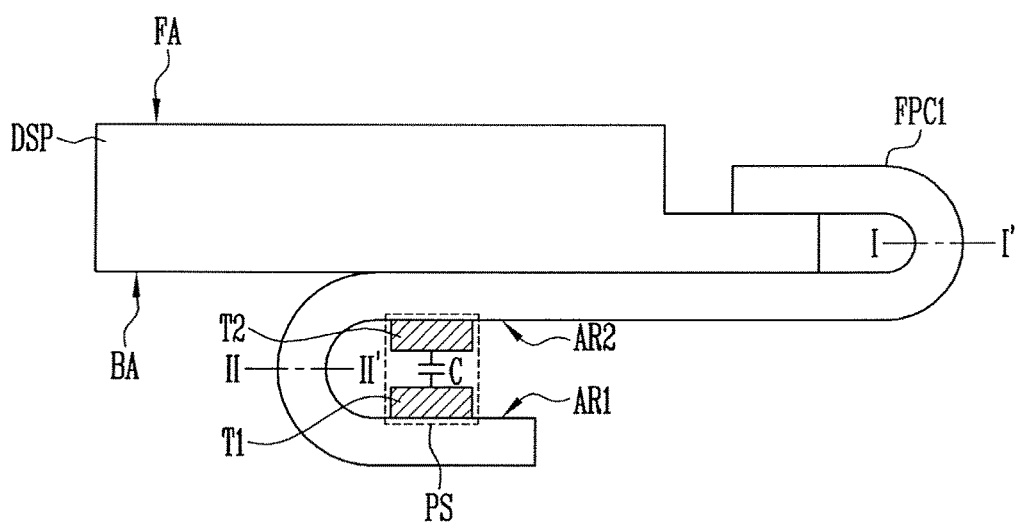
FIG. 3 is a cross-sectional view of the display panel and the flexible circuit board disposed in the display device according to an exemplary embodiment of the present invention.

FIG. 2 is a plan view schematically illustrating a connection relationship between the display panel DSP and the flexible circuit board FPC1 according to an exemplary embodiment of the present invention. FIG. 3 is a cross-sectional view of the display panel DSP and the flexible circuit board FPC1 disposed in the display device 100 according to an exemplary embodiment of the present invention.

As illustrated in FIGS. 1 and 2, the display panel DSP, according to an exemplary embodiment of the present invention, may have a rectangular shape with two sides opposite to each other and connected to each other by two other sides opposite to each other. For example, if the display panel DSP has a rectangular plate shape, the two sides opposite to each other may be longer than the two other sides opposite to each other.

However, a shape of the display panel DSP is not limited thereto. For example, one side of the display panel DSP may protrude or may be recessed, and at least one side or at least one vertex portion may be replaced with a curved portion with a predetermined curvature.

In addition, the display panel DSP may have various shapes, such as, a polygon, a circle or an ellipse, a semicircle or a semi-ellipse including a straight side and a curved side, or a combination thereof.

The flexible circuit board FPC1 may be connected to the display panel DSP, and may be folded or bent such that a second surface of the flexible circuit board FPC1 and a rear surface BA of the display panel DSP face each other above and below a first boundary I-I'. For example, the second surface of the flexible circuit board FPC1 may be disposed on the rear surface BA of the display panel DSP, below the first boundary I-I'.

The flexible circuit board FPC1 may include a first surface on which the first electrode T1 and the second electrode T2 of the pressure sensor PS are disposed, and a second surface facing the first surface.

The first surface of the flexible circuit board FPC1 may include a first area AR1, in which the first electrode T1 is disposed, and a second area AR2, in which the second electrode T2 is disposed.

The first area AR1 and the second area AR2 may be separated by a second boundary II-II'. For example, the first area AR1 may be below the second boundary II-II', and the second area AR2 may be above the second boundary II-II'. The second area AR2 may extend perpendicularly to the second boundary II-II' from the first area AR1. However, the present invention is not limited thereto. For example, the second area AR2 might not extend perpendicularly to the second boundary II-II' from the first area AR1, and/or may extend in a curved fashion.

In addition, the first area AR1 of the flexible circuit board FPC1 may have a polygonal shape, and the second area AR2 may have a rectangular shape. However, the first area AR1 and the second area AR2 of the flexible circuit board FPC1 may have various shapes, such as, a polygon, a circle or an ellipse, a semicircle or a semi-ellipse including a straight side and a curved side, or a combination thereof.

The flexible circuit board FPC1 may be folded or bent above and below the second boundary II-II'.

As illustrated in FIGS. 1 and 3, the display panel DSP may include a front surface FA displaying an image, and the rear surface BA on which the flexible circuit board FPC1 is disposed.

The flexible circuit board FPC1 may have one end connected to the display panel DSP, and the flexible circuit board FPC1 may be bent or folded around the display panel DSP to be disposed on the rear surface BA of the display panel DSP. In addition, the other end of the flexible circuit board FPC1 may be folded or bent in a direction in which the first area AR1, which is below the second boundary II-II', faces the second area AR2, which is above the second boundary II-II'.

The flexible circuit board FPC1 may be folded or bent above and below the second boundary II-II' in a direction such that at least a portion thereof overlaps the flexible circuit board FPC1 and the first electrode T1 faces the second electrode T2, according to an exemplary embodiment of the present invention.

In addition, the flexible circuit board FPC1 may be disposed in the display device 100 in a state of being folded or bent above and below the first boundary I-I' and the second boundary II-II'. A part of the flexible circuit board FPC1 may be fixed to the display device 100 so as to maintain the state of being folded or bent.

The flexible circuit board FPC1 may be disposed on at least one side surface of the display panel DSP in a state where one end thereof is connected to the display panel DSP and a portion of the flexible circuit board FPC1 is folded or bent above and below the first boundary I-I', according to an exemplary embodiment of the present invention. In addition, the flexible circuit board FPC1 may be disposed on the rear surface BA of the display panel DSP such that the other end of the flexible circuit board FPC1 is folded or bent in a direction in which the first area AR1 faces the second area AR2.

As the first area AR1 and the second area AR2 are folded or bent in a direction in which the first area AR1 faces the second area AR2, the first electrode T1 and the second electrode T2 may be disposed to be separated from each other with a constant gap therebetween.

The first electrode T1 of the pressure sensor PS disposed in the first area AR1 and the second electrode T2 of the pressure sensor PS disposed in the second area AR2 may form the capacitor C. If pressure is applied to the front surface FA of the display panel DSP by a touch or the like of the user 200, a gap between the first electrode T1 and the second electrode T2 may be changed, and thereby, the capacitance of the capacitor C may be changed.

The pressure sensor PS may sense a change of the capacitance of the capacitor C between the first electrode T1 and the second electrode T2, and may detect the intensity of the pressure, if the pressure which is generated by the touch or the like of the user 200 is applied thereto.

A display device of the related art measures a change of capacitance of a capacitor by disposing other conductive layers on a front surface or a rear surface of the display device so as to measure the intensity of pressure which is generated by a touch or the like of the user.

However, in the display device 100 according to an exemplary embodiment of the present invention, the first electrode T1 and the second electrode T2 may be disposed on a first surface of the flexible circuit board FPC1 to face each other. For example, the first electrode T1 and the second electrode T2 may be aligned with each other. A change of capacitance of the capacitor C formed between the first electrode T1 and the second electrode T2 may be sensed, and thus, the intensity of pressure which is generated by a touch or the like of the user 200 may be measured without another conductive layer disposed between the first electrode T1 and the second electrode T2.

Figure 4:
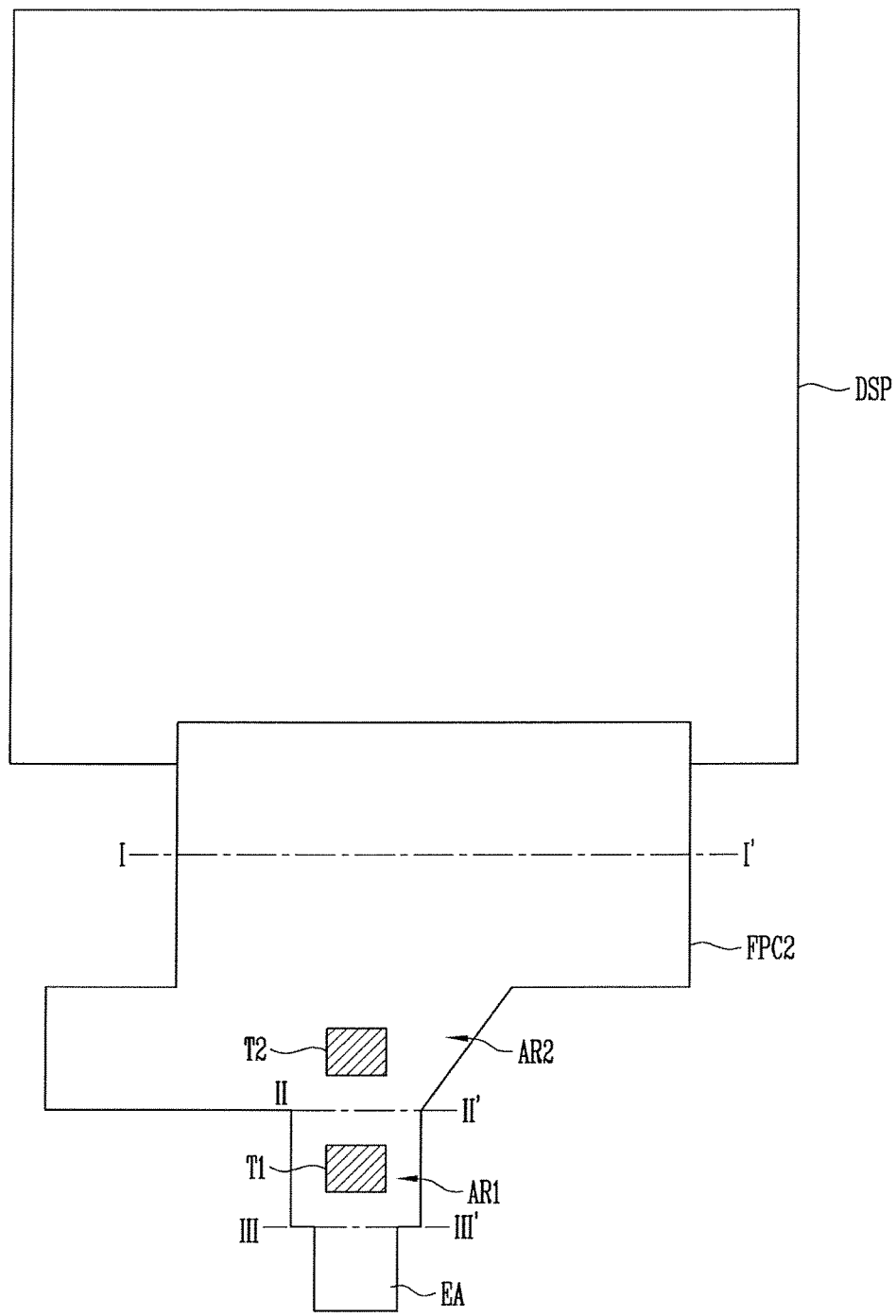
FIG. 4 is a plan view schematically illustrating a connection relationship between a display panel and a flexible circuit board according to an exemplary embodiment of the present invention.
Figure 5:
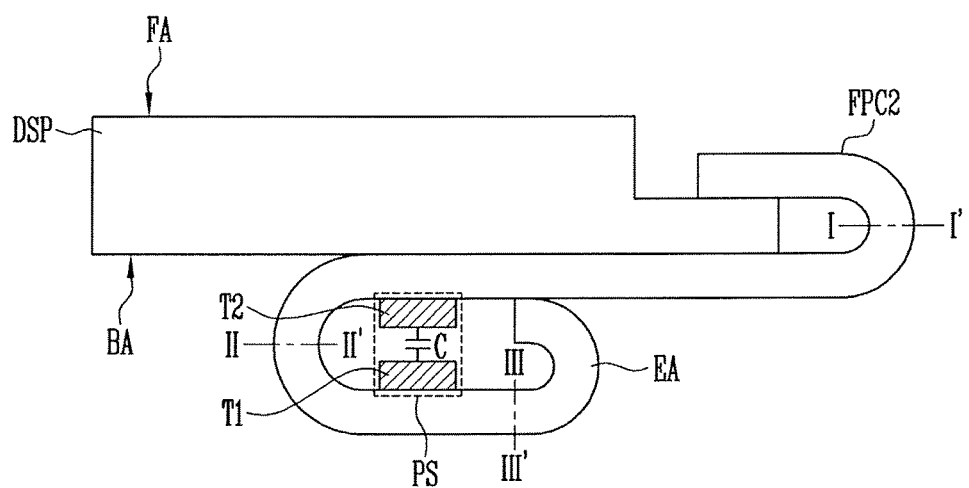
FIG. 5 is a cross-sectional view of the display panel and the flexible circuit board disposed in a display device according to an exemplary embodiment of the present invention.

FIG. 4 is a plan view schematically illustrating a connection relationship between a display panel DSP and a flexible circuit board FPC2 according to an exemplary embodiment of the present invention. FIG. 5 is a cross-sectional view of the display panel DSP and the flexible circuit board FPC2 disposed in a display device 100 according to an exemplary embodiment of the present invention.

The display panel DSP and a pressure sensor PS according to the exemplary embodiment of the present invention illustrated in FIGS. 4 and 5 may be substantially the same as the display panel DSP and the pressure sensor PS according to the exemplary embodiment of the present invention illustrated in FIGS. 1 to 3. In addition, the flexible circuit board FPC2 according to the exemplary embodiment of the present invention illustrated in FIGS. 4 and 5 will be described by focusing on portions different from the flexible circuit board FPC1 according to a previous embodiment illustrated in FIGS. 2 and 3 so as to avoid repeated descriptions. Features and elements that are not described in particular in the present exemplary embodiment of the present invention may conform to the display device 100 according to an aforementioned embodiment. Accordingly, the same symbol or numerical number may refer to the same configuration element, and a similar symbol or numerical number may refer to a similar configuration element.

As illustrated in FIG. 4, a first surface of the flexible circuit board FPC2 may include the first area AR1 in which the first electrode T1 is disposed, the second area AR2 in which the second electrode T2 is disposed, and an extension portion EA which is disposed to be adjacent to the first area AR1.

The first area AR1 may be below the second boundary II-II' and the second area AR2 may be above the second boundary II-II', and the first area AR1 and the extension portion EA may be separated by a third boundary III-III'. For example, the first area AR1 may be above the third boundary III-III' and the extension portion EA may be below the third boundary III-III'.

The second area AR2 may extend perpendicularly to the second boundary II-II' from the first area AR1. However, the present invention is not limited thereto. For example, the second area AR2 might not extend perpendicularly to the second boundary II-II' from the first area AR1, and/or may extend in a curved fashion.

In addition, the extension portion EA may extend perpendicularly to the third boundary III-III' from the first area AR1. However, the present invention is not limited thereto.

For example, the extension portion EA might not extend perpendicularly to the third boundary III-III' from the first area AR1, and/or may extend in a curved fashion.

In addition, the first area AR1 of the flexible circuit board FPC2 may have a polygonal shape, and the second area AR2 and the extension portion EA may each have a rectangular shape. However, the first area AR1, the second area AR2, and the extension portion EA of the flexible circuit board FPC2 may have various shapes, such as, a polygon, a circle or an ellipse, or a semicircle or a semi-ellipse including a straight side and a curved side, or a combination thereof.

The flexible circuit board FPC2 may be folded or bent above and below the first boundary I-I' and may be folded or bent above and below the second boundary II-II'.

For example, the flexible circuit board FPC2 may be folded or bent in a direction towards the display panel DSP above and below the first boundary I-I', and may be folded or bent in a direction in which the first area AR1, which is above the second boundary II-II', faces the second area AR2, which is below the second boundary II-II'.

In addition, the flexible circuit board FPC2 may be folded or bent above and below the third boundary III-III'. For example, the flexible circuit board FPC2 may be folded or bent in a direction in which the first area AR1 faces the extension portion EA. For example, the extension portion EA of the flexible circuit board FPC2 may be bent or folded in a direction towards the first and second electrodes T1 and T2 or the second area AR2.

As illustrated in FIG. 5, the display panel DSP may include the front surface FA on which an image is displayed and the rear surface BA on which the flexible circuit board FPC2 is disposed.

The flexible circuit board FPC2 may have one end connected to the display panel DSP and a portion of the flexible circuit board FPC2 may be folded or bent above and below the first boundary I-I' to be disposed on the rear surface BA of the display panel DSP. In addition, the other end of the flexible circuit board FPC2 may be folded or bent in a direction in which the first area AR1 faces the second area AR2. In addition, the flexible circuit board FPC2 may be disposed to be folded or bent in a direction in which the first area AR1 faces the extension portion EA.

In addition, the flexible circuit board FPC2 may be disposed in the display device 100 in a state of being folded or bent above and below the first boundary I-I' and the second boundary II-II', and a part of the flexible circuit board FPC2 may be fixed to the display device 100 so as to maintain the state of being folded or bent. In addition, the extension portion EA of the flexible circuit board FPC2 may be fixed to the first surface of the flexible circuit board FPC2 in a state of being folded or bent.

The capacitor C, which is formed by the first electrode T1 and the second electrode T2, may maintain a constant capacitance prior to pressure, which is generated by a touch or the like, being applied thereto. Hence, the extension portion EA of the flexible circuit board FPC2 may have restoring force for maintaining a constant gap between the first electrode T1 and the second electrode T2 and may accordingly maintain a constant capacitance of the capacitor C.

For example, in a case where a gap between the first electrode T1 and the second electrode T2 is narrowed by pressure which is generated by a touch or the like of the user 200, if the pressure relents, the gap between the first electrode T1 and the second electrode T2 may be restored to an original state by the restoring force of the extension portion EA.

As such, the flexible circuit board FPC2 according to an exemplary embodiment of the present invention may be restored to an original state by the restoring force of the extension portion EA, even if the flexible circuit board FPC2 is bent by pressure which is generated by a touch that is repeatedly applied. Hence, the first electrode T1 and the second electrode T2 of the pressure sensor PS may maintain constant capacitance of the capacitor C for measuring the intensity of pressure, if the pressure which is generated by a touch or the like relents.

An elastic layer with the restoring force may be disposed between the first electrode T1 and the second electrode T2, according to an exemplary embodiment of the present invention.

Figure 6:
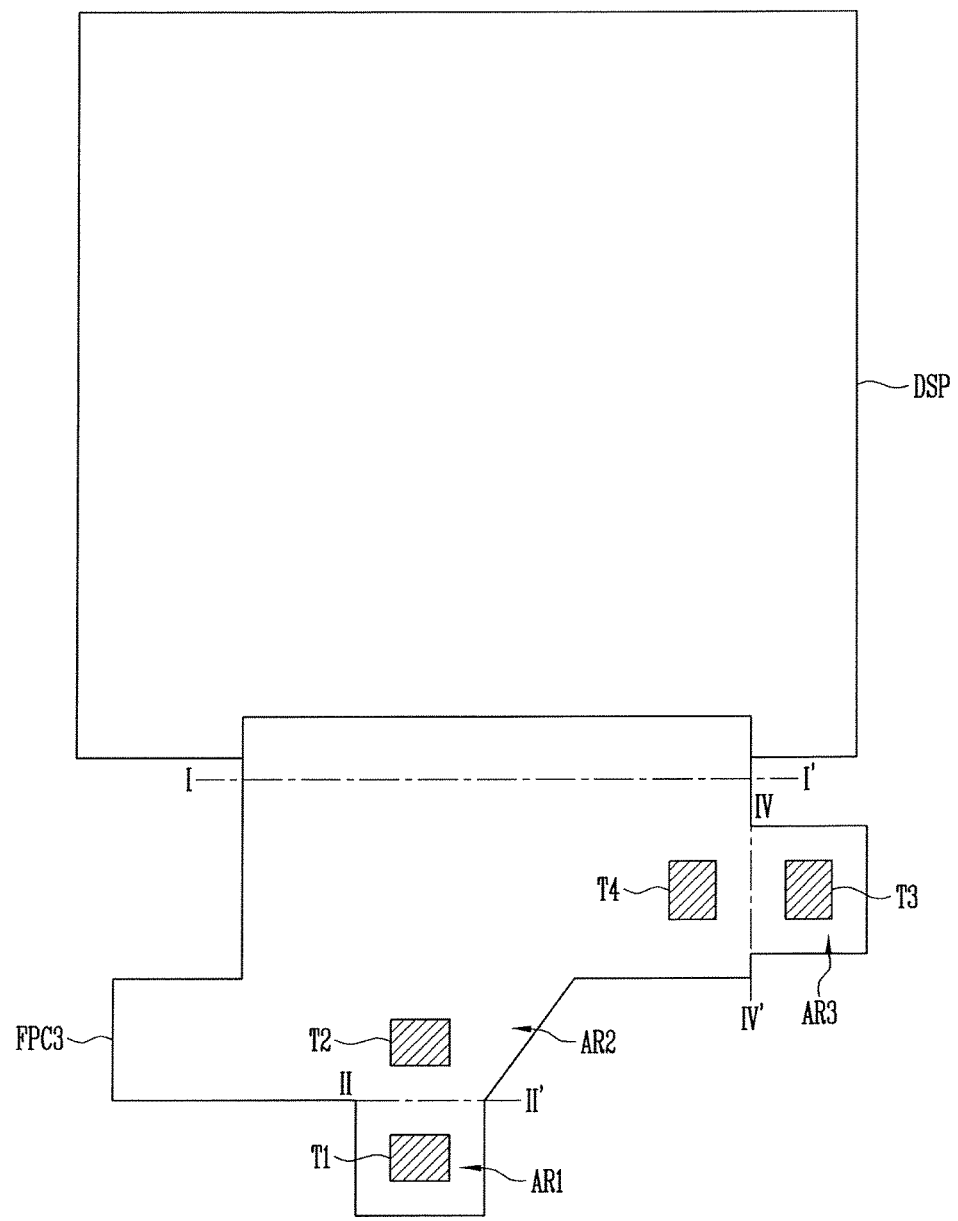
FIG. 6 is a plan view schematically illustrating a connection relationship between a display panel and a flexible circuit board according to an exemplary embodiment of the present invention.

FIG. 6 is a plan view schematically illustrating a connection relationship between a display panel DSP and a flexible circuit board FPC3 according to an exemplary embodiment of the present invention.

A display panel DSP and a pressure sensor PS according to an exemplary embodiment of the present invention illustrated in FIG. 6 may be substantially the same as the display panel DSP and the pressure sensor PS according to an exemplary embodiment of the present invention illustrated in FIGS. 1 to 3. In addition, a flexible circuit board FPC3 according to the present exemplary embodiment of the present invention illustrated in FIG. 6 will be described by focusing on portions different from the flexible circuit board FPC1 according to an exemplary embodiment illustrated in FIG. 2 so as to avoid repeated descriptions. Features and elements which are not described in particular in the present exemplary embodiment of the present invention may conform to the display device 100 according to an aforementioned embodiment, and the same symbol or numerical number may refer to the same configuration element, and a similar symbol or numerical number may refer to a similar configuration element.

As illustrated in FIG. 6, a first surface of the flexible circuit board FPC3 may include the first area AR1 in which the first electrode T1 is disposed, the second area AR2 in which the second electrode T2 and a fourth electrode T4 are disposed, and a third area AR3 in which a third electrode T3 is disposed. Here, the third electrode T3 and the fourth electrode T4, which face each other, may be designed such that their sizes, lengths, and shape may be adjusted for a predetermined capacitance range. The third and fourth electrodes T3 and T4 may include the same material as the first electrode T1 and the second electrode T2, or may include materials different from each other.

The first area AR1 and the second area AR2 may be separated from each other and may be respectively positioned below and above the second boundary II-II', and the second area AR2 and the third area AR3 may be separated from each other and may be respectively positioned above and below a fourth boundary IV-IV'.

The flexible circuit board FPC3 may be folded or bent above and below the first boundary I-I', may be folded or bent above and below the second boundary II-II', and may be folded or bent above and below the fourth boundary IV-IV'.

For example, the flexible circuit board FPC3 may be folded or bent, above and below the first boundary I-I', in a direction towards the display panel DSP, may be folded or bent, above and below the second boundary II-II', in a direction in which the first area AR1 faces the second area AR2, and may be folded or bent, above and below the fourth boundary IV-IV', in a direction in which the second area AR2 faces the third area AR3.

The third area AR3 may extend from the second area AR2 perpendicularly to the fourth boundary IV-IV'. However, the present invention is not limited thereto. For example, the third area AR3 might not extend perpendicularly to the fourth boundary IV-IV' from the second area AR2, and/or may extend in a curved fashion.

In addition, the third area AR3 of the flexible circuit board FPC3 may have a rectangular shape. However, the third area AR3 of the flexible circuit board FPC3 may have various shapes, such as, a polygon, a circle or an ellipse, a semicircle or a semi-ellipse including a straight side and a curved side, or a combination thereof.

As the first area AR1 and the second area AR2 are folded or bent in a direction in which the first area AR1 faces the second area AR2, the first electrode T1 and the second electrode T2 may be disposed to be separated from each other with a constant gap between the first electrode T1 and the second electrode T2. The first electrode T1 and the second electrode T2 may form the capacitor C.

As the second area AR2 and the third area AR3 are folded or bent in a direction in which the second area AR2 faces the third area AR3, the third electrode T3 and the fourth electrode T4 may be disposed to be separated from each other with a constant gap therebetween. The third electrode T3 and the fourth electrode T4 may form the capacitor C.

If pressure is applied to the front surface FA of the display panel DSP by a touch or the like of the user 200, a first gap between the first electrode T1 and the second electrode T2 and a second gap between the third electrode T3 and the fourth electrode T4 may be changed simultaneously. At this time, the amount of change of the first gap and the amount of change of the second gap may be the same as or different from each other.

As the first gap and the second gap change, the capacitance of the capacitor C formed between the first electrode T1 and the second electrode T2 and the capacitance of the capacitor C formed between the third electrode T3 and the fourth electrode T4 may change.

The pressure sensor PS may more accurately detect the intensity of pressure which is generated by a touch or the like of the user 200 by combining the change of capacitance of the capacitor C formed between the first electrode T1 and the second electrode T2 and the change of capacitance of the capacitor C formed between the third electrode T3 and the fourth electrode T4.

A method of detecting the intensity of pressure by using the change of the capacitance of the capacitor C formed between the first electrode T1 and the second electrode T2 and the change of the capacitance of the capacitor C formed between the third electrode T3 and the fourth electrode T4 on the flexible circuit board FPC3 according to an exemplary embodiment of the present invention is described. However, this is only an example for providing a better understanding of the present invention, and the display device 100 according to an exemplary embodiment of the present invention may include a plurality of electrodes for forming capacitors configured to change by a touch or the like of the user 200 with respect to the capacitors' capacitance.

Figure 7:
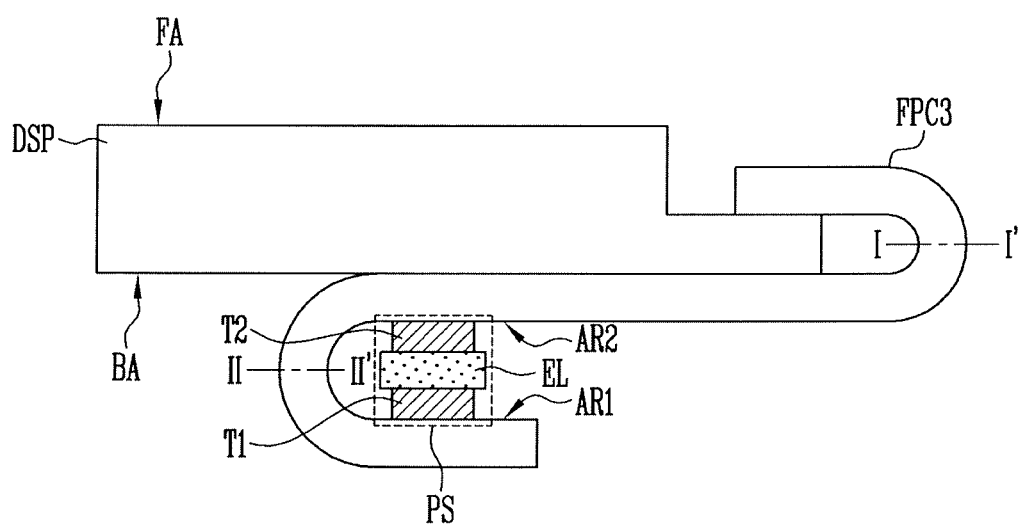
FIG. 7 is a cross-sectional view of a display panel and a flexible circuit board disposed in a display device according to an exemplary embodiment of the present invention.

FIG. 7 is a cross-sectional view of the display panel DSP and the flexible circuit board FPC3 disposed in the display device 100 according to an exemplary embodiment of the present invention.

The display panel DSP, a flexible circuit board FPC3, and a pressure sensor PS according to an exemplary embodiment of the present invention illustrated in FIG. 7 are substantially the same as the display panel DSP, the flexible circuit board FPC1, and the pressure sensor PS according to a previous exemplary embodiment of the present invention illustrated in FIGS. 1 to 3. Thus, repeated descriptions may be hereinafter omitted. Features and elements which are not described in particular in the present exemplary embodiment of the present invention may conform to the display device 100 according to an aforementioned embodiment. Accordingly, the same symbol or numerical number may refer to the same configuration element, and a similar symbol or numerical number may refer to a similar configuration element.

As illustrated in FIG. 7, as the first area AR1 and the second area AR2 are folded or bent in a direction in which the first area AR1 faces the second area AR2, the first electrode T1 and the second electrode T2 may be disposed on the flexible circuit board FPC3 to be separated from each other with a constant gap therebetween, and an elastic layer EL may be disposed between the first electrode T1 and the second electrode T2.

The elastic layer EL may include an elastic material, and may have a restoring force property by which the elastic layer EL is restored to an original state if a pressure relents after previously being applied to the elastic layer EL such that the elastic layer is deformed (e.g., temporarily reduced in thickness).

For example, the elastic layer EL may be a spacer layer formed with an airgap, a layer formed with a shock absorbing material, or a layer formed with a dielectric material, but the elastic layer EL is not limited to this.

The capacitor C which is formed by the first electrode T1 and the second electrode T2 may have to maintain a constant gap therebetween if pressure is not applied by a touch or the like. Hence, the elastic layer EL may maintain a constant gap between the first electrode T1 and the second electrode T2.

For example, in a case where the gap between the first electrode T1 and the second electrode T2 is narrowed by pressure which is generated by a touch or the like of the user 200, if the pressure relents, the gap between the first electrode T1 and the second electrode T2 may be restored to an original state by the restoring force of the elastic layer EL.

As such, the flexible circuit board FPC3 according to an exemplary embodiment of the present invention may be restored to an original state by the restoring force of the elastic layer EL, even if the flexible circuit board FPC3 is bent by pressure, which is generated by a touch or the like, that is repeatedly applied. Hence, the first electrode T1 and the second electrode T2 of the pressure sensor PS may maintain a constant capacitance of the capacitor C for measuring the intensity of pressure, if the pressure which is generated by a touch or the like relents.

Figure 8:
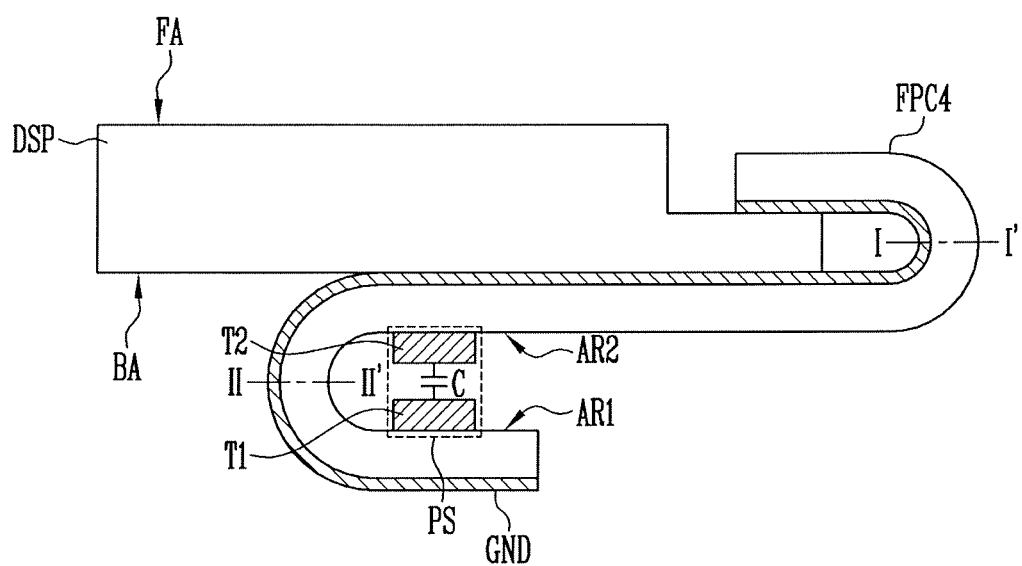
FIG. 8 is a cross-sectional view of a display panel and a flexible circuit board disposed in a display device according to an exemplary embodiment of the present invention.

FIG. 8 is a cross-sectional view of the display panel DSP and a flexible circuit board FPC4 disposed in a display device 100 according to an exemplary embodiment of the present invention.

The display panel DSP, the flexible circuit board FPC4, and a pressure sensor PS according to an exemplary embodiment of the present invention illustrated in FIG. 8 are substantially the same as the display panel DSP, the flexible circuit board FPC1, and the pressure sensor PS according to a previous exemplary embodiment of the present invention illustrated in FIGS. 1 to 3. Thus, repeated descriptions may be hereinafter omitted. Features and elements which are not described in particular in the present exemplary embodiment of the present invention may conform to the display device 100 according to an aforementioned embodiment. Accordingly, the same symbol or numerical number may refer to the same configuration element, and a similar symbol or numerical number may refer to a similar configuration element.

As illustrated in FIG. 8, the flexible circuit board FPC4 may include a first surface on which the first electrode T1 and the second electrode T2 are disposed. A second surface of the flexible circuit board FPC4 faces the first surface of the flexible circuit board FPC4.

A ground electrode GND may be disposed on the second surface of the flexible circuit board FPC4, and may overlap areas on the second surface. The ground electrode GND may block noise which may be introduced into the first electrode T1 and the second electrode T2.

In addition, the ground electrode GND may be folded or bent in the same directions as the flexible circuit board FPC4, when the flexible circuit board FPC4 is folded or bent above and below the first boundary I-I' and the second boundary II-II'.

For example, if the flexible circuit board FPC4 is disposed on the rear surface BA of the display panel DSP by being folded or bent above and below the first boundary I-I', the ground electrode GND may be disposed on the rear surface BA of the display panel DSP by being folded or bent above and below the first boundary I-I' in accordance with the folding or bending of the flexible circuit board FPC4. For example, the ground electrode GND may be disposed between the rear surface BA of the display panel DSP and the flexible circuit board FPC4.

In addition, even if the flexible circuit board FPC4 is folded or bent in a direction in which the first area AR1 faces the second area AR2 above and below the second boundary II-II', the ground electrode GND may be disposed to be folded or bent above and below the second boundary II-II' in accordance with the bending or folding of the flexible circuit board FPC4.

Since the ground electrode GND may block noise which may be introduced into the first electrode T1 and the second electrode T2, the capacitance of the capacitor C formed between the first electrode T1 and the second electrode T2 might not be changed by noise and actions other than the change of the gap between the first electrode T1 and the second electrode T2.

Figure 9:
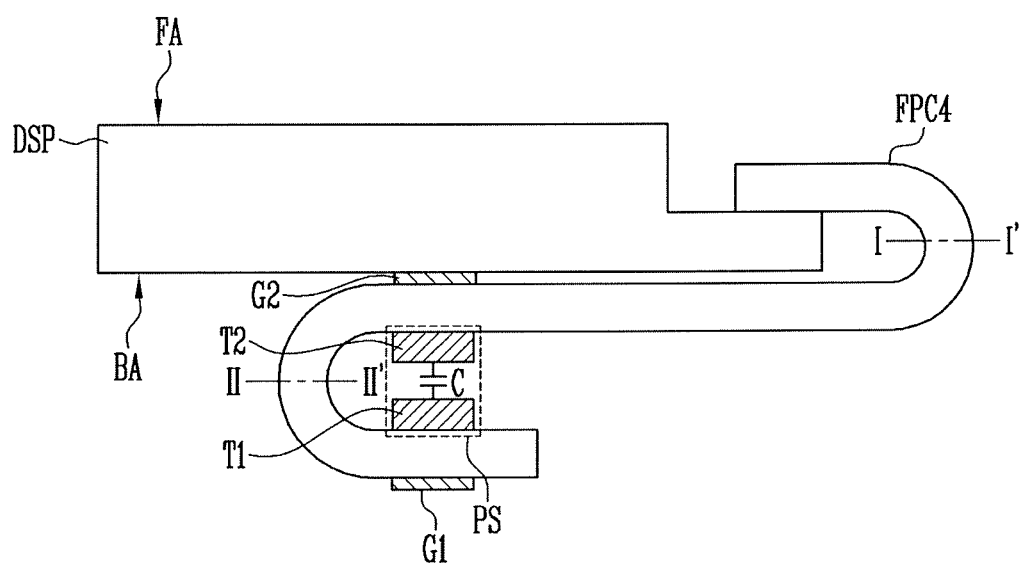
FIG. 9 is a cross-sectional view of a display panel and a flexible circuit board disposed in a display device according to an exemplary embodiment of the present invention.

FIG. 9 is a cross-sectional view of the display panel DSP and a flexible circuit board FPC4 disposed in a display device 100 according to an exemplary embodiment of the present invention.

The display panel DSP and the flexible circuit board FPC4 according to an exemplary embodiment of the present invention illustrated in FIG. 9 are substantially the same as the display panel DSP and the flexible circuit board FPC1 according to an exemplary embodiment of the present invention illustrated in FIGS. 1 to 3. Thus, repeated descriptions may be hereinafter omitted. Features and elements which are not described in particular in the present exemplary embodiment of the present invention may conform to the display device 100 according to an aforementioned embodiment. Accordingly, the same symbol or numerical number may refer to the same configuration element, and a similar symbol or numerical number may refer to a similar configuration element.

As illustrated in FIG. 9, the flexible circuit board FPC4 may include a first surface, on which the first electrode T1 and the second electrode T2 are disposed, and a second surface facing the first surface of the flexible circuit board FPC4.

A first conductive guard G1 and a second conductive guard G2 may be disposed on the second surface of the flexible circuit board FPC4. The first conductive guard G1 may face the first electrode T1, and the second conductive guard G2 may face the second electrode T2.

The pressure sensor PS may prevent electric charges from moving between the first conductive guard G1 and the first electrode T1 by supplying power supply voltages with the same phase to the first conductive guard G1 and the first electrode T1. By doing so, the pressure sensor PS may prevent a parasitic capacitor C from being generated between the first conductive guard G1 and the first electrode T1.

In addition, the pressure sensor PS may prevent electric charges from moving between the second conductive guard G2 and the second electrode T2 by supplying power supply voltages with the same phase to the second conductive guard G2 and the second electrode T2. By doing so, the pressure sensor PS may prevent a parasitic capacitor C from being generated between the second conductive guard G2 and the second electrode T2.

The pressure sensor PS may supply voltages with the same phase or voltages with phases different from each other to the first conductive guard G1 and the second conductive guard G2, according to an exemplary embodiment of the present invention.

The first conductive guard G1 and the second conductive guard G2 may include a conductive material. For example, the first and second conductive guards G1 and G2 may include a metal or an alloy.

The display device 100 according to an exemplary embodiment of the present invention may prevent the parasitic capacitor C between the first conductive guard G1 and the first electrode T1 and the parasitic capacitor C between the second conductive guard G2 and the second electrode T2 from being generated, and thus, noise which is introduced into the first electrode T1 and the second electrode T2 may be efficiently blocked.

Figure 10:
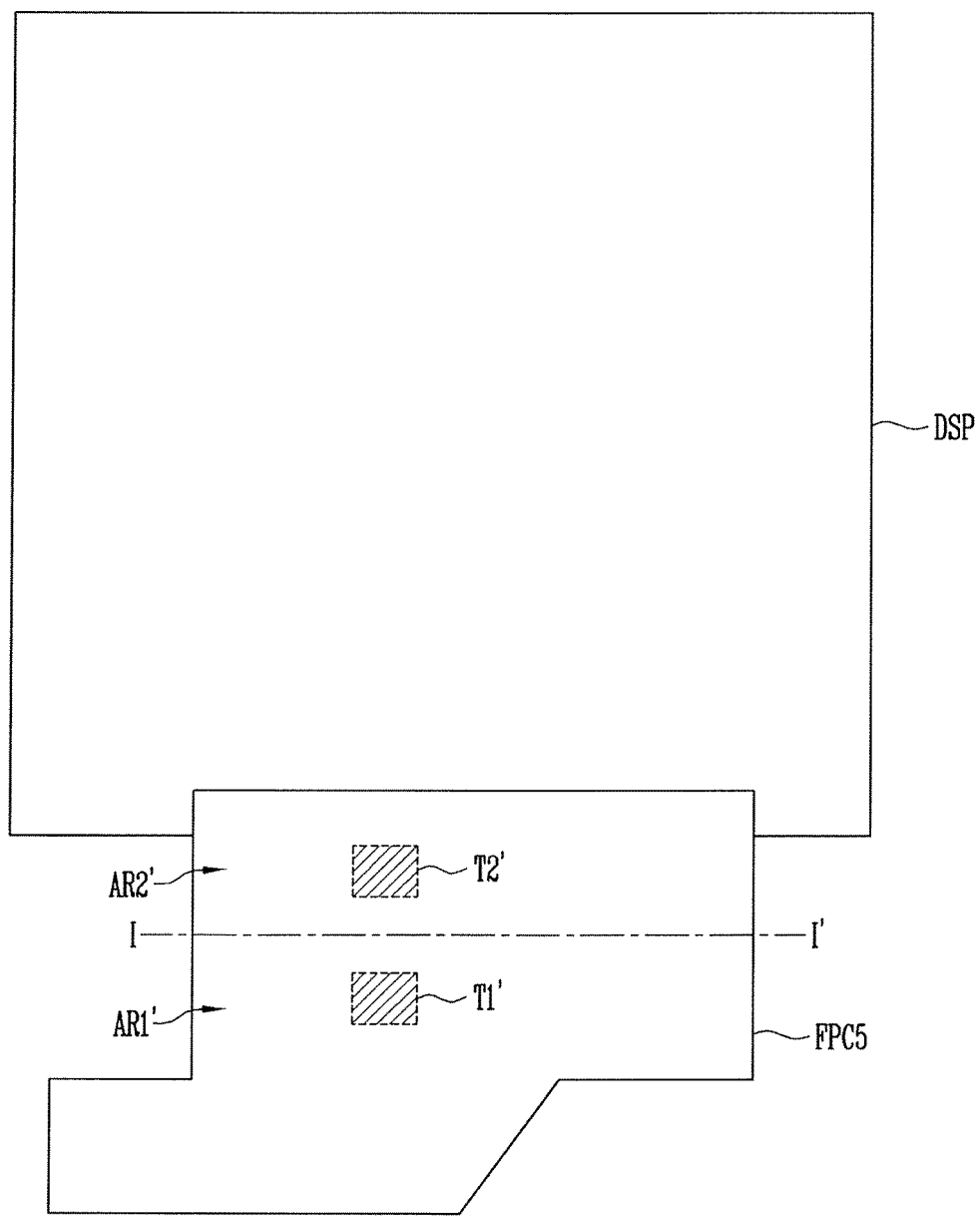
FIG. 10 is a plan view schematically illustrating a connection relationship between a display panel and a flexible circuit board according to an exemplary embodiment of the present invention.
Figure 11:
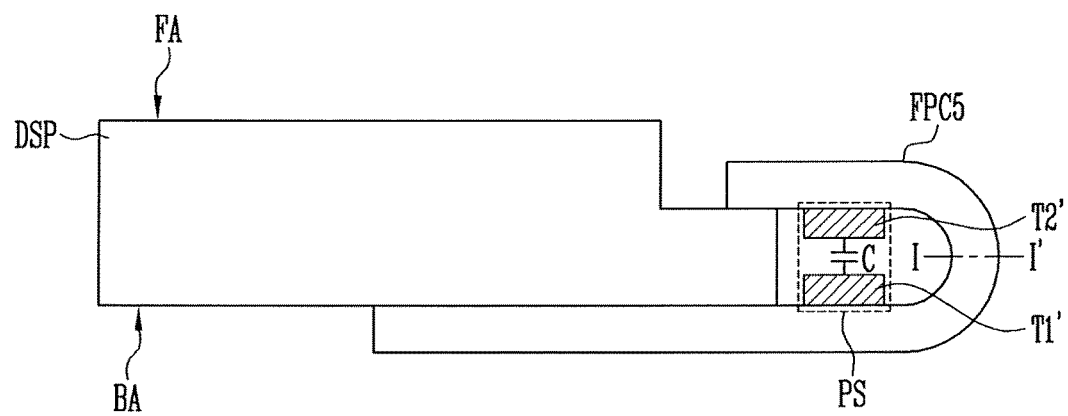
FIG. 11 is a cross-sectional view of the display panel and the flexible circuit board disposed in a display device according to an exemplary embodiment of the present invention.

FIG. 10 is a plan view schematically illustrating a connection relationship between the display panel DSP and a flexible circuit board FPC5 according to an exemplary embodiment of the present invention. FIG. 11 is a cross-sectional view of the display panel DSP and the flexible circuit board FPC5 disposed in a display device 100 according to an exemplary embodiment of the present invention.

The display panel DSP and the pressure sensor PS according to an exemplary embodiment of the present invention illustrated in FIGS. 10 and 11 may be substantially the same as the display panel DSP and the pressure sensor PS according to an exemplary embodiment of the present invention illustrated in FIGS. 1 to 3. Features and elements which are not described in particular in the present exemplary embodiment of the present invention may conform to the display device 100 according to an aforementioned embodiment. Accordingly, the same symbol or numerical number may refer to the same configuration element, and a similar symbol or numerical number may refer to a similar configuration element.

As illustrated in FIG. 10, a flexible circuit board FPC5 may include a first surface and a second surface facing the first surface, and a first electrode T1' and a second electrode T2' of the pressure sensor PS may be disposed on the second surface.

The second surface of the flexible circuit board FPC5 may include a first area AR1' in which the first electrode T1' is disposed and a second area AR2' in which the second electrode T2' is disposed.

The first area AR1' and the second area AR2' may be separated from each other and may be respectively positioned below and above the first boundary I-I'. The second area AR2' may extend perpendicularly to the first boundary I-I' from the first area AR1'. However, the present invention is not limited thereto. For example, the second area AR2' might not extend perpendicularly to the first boundary I-I' from the first area AR1', and/or may extend in a curved fashion.

The flexible circuit board FPC5 may be folded or bent above and below the first boundary I-I'.

As illustrated in FIG. 11, one end of the flexible circuit board FPC5 may be connected to the display panel DSP and the flexible circuit board FPC5 may be folded or bent in a direction in which the first area AR1' and the second area AR2' face each other from above and below the first boundary I-I'.

As the first area AR1' and the second area AR2' are folded or bent in a direction in which the first area AR1' faces the second area AR2', a first electrode T1' and a second electrode T2' may be disposed to be separated from each other with a constant gap therebetween. For example, the first electrode T1' may be disposed in the first area AR1', and the second electrode T2 may be disposed in the second area AR2'.

The first electrode T1' of the pressure sensor PS disposed in the first area AR1' and the second electrode T2' of the pressure sensor PS disposed in the second area AR2' may form the capacitor C together. If pressure is applied to the front surface FA of the display panel DSP by a touch or the like of the user 200, a gap between the first electrode T1' and the second electrode T2' may be changed, and thus, capacitance of the capacitor C may be changed.

The pressure sensor PS may sense a change of the capacitance of the capacitor C between the first electrode T1' and the second electrode T2', and thus, may detect an intensity of the pressure, if the pressure which is generated by the touch or the like of the user 200 is applied thereto.

The flexible circuit board FPC5 may further include a ground electrode GND which is disposed on a first surface thereof, and the ground electrode GND may block noise which is introduced into the first electrode T1' and the second electrode T2', according to an exemplary embodiment of the present invention. The ground electrode GND may be folded or bent in the same direction as that of the flexible circuit board FPC5, when the flexible circuit board FPC5 is folded or bent above and below the first boundary I-I'.

The flexible circuit board FPC5 may further include a first conductive guard and a second conductive guard which are disposed on the first surface of the flexible circuit board FPC5. The first conductive guard G1 may receive voltages with the same phase as voltages being received by the first electrode T1' and may be disposed to face the first electrode T1' according to an exemplary embodiment of the present invention. The second conductive guard G2 may receive voltages with the same phase as voltages being received by the second electrode T2' and may be disposed to face the second electrode T2', according to an exemplary embodiment of the present invention.

Figure 12:
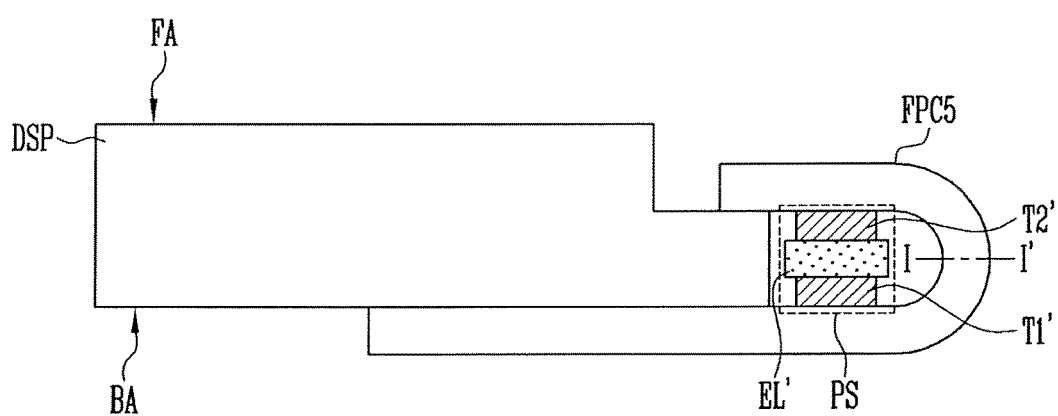
FIG. 12 is a cross-sectional view of a display panel and a flexible circuit board disposed in a display device according to an exemplary embodiment of the present invention.

FIG. 12 is a cross-sectional view of a display panel DSP and a flexible circuit board FPC5 disposed in a display device 100 according to an exemplary embodiment of the present invention.

The display panel DSP, the flexible circuit board FPC5, and the pressure sensor PS according to the present exemplary embodiment of the present invention illustrated in FIG. 12 are substantially the same as the display panel DSP, the flexible circuit board FPC1, and the pressure sensor PS according to a previous exemplary embodiment of the present invention illustrated in FIGS. 1 to 3. Thus, repeated descriptions may be hereinafter omitted. Features and elements which are not described in particular in the present exemplary embodiment of the present invention may conform to the display device 100 according to an aforementioned embodiment. Accordingly, the same symbol or numerical number may refer to the same configuration element, and a similar symbol or numerical number may refer to a similar configuration element.

As illustrated in FIG. 12, an elastic layer EL' may be disposed between the first electrode T1' and the second electrode T2'.

The elastic layer EL' may maintain a constant gap between the first electrode T1' and the second electrode T2'.

For example, in a case where a gap between the first electrode T1' and the second electrode T2' is narrowed by pressure which is generated by a touch or the like of the user 200, if the pressure which is generated by the touch or the like disappears, the gap between the first electrode T1' and the second electrode T2' may be restored to an original state by a restoring force of the elastic layer EL'. Hence, the first electrode T1' and the second electrode T2' may maintain constant capacitance of the capacitor C for measuring an intensity of the pressure, if the pressure which is generated by a touch or the like disappears.

While the present invention has been particularly shown and described with reference to exemplary embodiments thereof, it will be apparent to those of ordinary skill in the art that various changes in form and detail may be made thereto without departing from the spirit and scope of the present invention.

What is claimed is:

1. A display device, comprising:
    a display panel configured to display an image on a front surface thereof;
    a flexible circuit board connected to the display panel and configured to drive the display panel; and
    a pressure sensor including a first electrode and a second electrode, wherein the pressure sensor is configured to sense a change of capacitance of a capacitor, which is formed between the first electrode and the second electrode, in accordance with a pressure applied thereto,
    wherein the first electrode and the second electrode are disposed on a first surface or a second surface facing the first surface of the flexible circuit board,
    wherein the flexible circuit board is folded or bent around the display panel near one end of the display panel, and is further folded or bent in a portion on a rear surface of the display panel, and
    wherein the first electrode and the second electrode overlap each other.

2. The display device of claim 1,
    wherein the portion includes a first area in which the first electrode is disposed, and a second area in which the second electrode is disposed.

3. The display device of claim 2, wherein the portion is folded or bent in a direction in which the first area faces the second area such that the first electrode and the second electrode overlap each other.

4. The display device of claim 3, further comprising:
    an elastic layer disposed between the first electrode and the second electrode.

5. The display device of claim 3, wherein the flexible circuit board further includes a ground electrode disposed on the second surface.

6. The display device of claim 3,
wherein the flexible circuit board further includes a first conductive guard and a second conductive guard each disposed on the second surface, and
wherein the first conductive guard faces the first electrode and the second conductive guard faces the second electrode.

7. The display device of claim 3,
wherein the flexible circuit board further includes an extension portion which extends from the first area, and
wherein the extension portion is folded or bent in a direction towards the second area.

8. The display device of claim 7, further comprising:
an elastic layer which is disposed between the first area and the second area.

9. The display device of claim 1,
wherein the second surface includes a first area in which the first electrode is disposed, and a second area in which the second electrode is disposed, and
wherein the portion is folded or bent in a direction in which the first area faces the second area such that the first electrode and the second electrode overlap each other.

10. The display device of claim 9, further comprising:
an elastic layer disposed between the first electrode and the second electrode.

11. The display device of claim 9, wherein the flexible circuit board further includes a ground electrode disposed on the first surface.

12. The display device of claim 9,
wherein the flexible circuit board further includes a first conductive guard and a second conductive guard each disposed on the first surface, and
wherein the first conductive guard faces the first electrode and the second conductive guard faces the second electrode.

13. The display device of claim 1, further comprising:
a touch panel disposed on the display panel and configured to sense a touch.

14. A display device comprising:
a display panel;
a flexible circuit board connected to the display panel, and including a first bend portion bending around the display panel near one end of the display panel, and a second bend portion bending on a rear surface of the display panel; and
a pressure sensor including a capacitor having a first electrode and second electrode facing the first electrode,
wherein the first electrode and the second electrode are each disposed on a first surface or a second surface facing the first surface of the flexible circuit board, and
wherein the first electrode and the second electrode overlap each other.

15. The display device of claim 14, wherein the first surface of the flexible circuit board includes a first area in which the first electrode is disposed and a second area in which the second electrode is disposed, and
wherein the second bend portion is bended in a direction such that the first electrode and the second electrode are aligned with each other.

16. The display device of claim 15, wherein the flexible circuit board further includes an extension portion extending from the first area and bending in a direction such that the extension portion is in contact with the first surface of the flexible circuit board.

17. The display device of claim 14, wherein an elastic layer is disposed between the first electrode and the second electrode.

18. The display device of claim 17, wherein the elastic layer may include an airgap, a shock absorbing material, or a dielectric material.

19. The display device of claim 14, wherein a ground electrode is disposed between the flexible circuit board and the display panel.

* * * * *